(12) United States Patent
Nazar et al.

(10) Patent No.: US 11,688,486 B2
(45) Date of Patent: *Jun. 27, 2023

(54) RETENTION VOLTAGE MANAGEMENT FOR A VOLATILE MEMORY

(71) Applicant: Apple Inc., Cupertino, CA (US)

(72) Inventors: Shahzad Nazar, Fremont, CA (US); Mohamed H. Abu-Rahma, Mountain View, CA (US); Amrinder S. Barn, San Jose, CA (US)

(73) Assignee: Apple Inc., Cupertino, CA (US)

( * ) Notice: Subject to any disclaimer, the term of this patent is extended or adjusted under 35 U.S.C. 154(b) by 2 days.

This patent is subject to a terminal disclaimer.

(21) Appl. No.: 17/402,915

(22) Filed: Aug. 16, 2021

(65) Prior Publication Data

US 2022/0028479 A1 Jan. 27, 2022

Related U.S. Application Data (63) Continuation of application No. 16/677,470, filed on Nov. 7, 2019, now Pat. No. 11,094,395.

(51) Int. Cl.
*G11C 5/14* (2006.01)
*G11C 29/50* (2006.01)
*G11C 11/419* (2006.01)
*G11C 29/12* (2006.01)
*G11C 11/409* (2006.01)

(52) U.S. Cl.
CPC ...... *G11C 29/50016* (2013.01); *G11C 11/409* (2013.01); *G11C 11/419* (2013.01); *G11C 29/12005* (2013.01); *G11C 2029/5004* (2013.01)

(58) Field of Classification Search
CPC ............................................. G11C 29/50016
See application file for complete search history.

(56) References Cited

U.S. PATENT DOCUMENTS

| | | | |
|---|---|---|---|
| 8,755,237 B2 | 6/2014 | Loh | |
| 8,908,421 B2 | 12/2014 | Liaw | |
| 9,786,385 B2 * | 10/2017 | Xu | G11C 29/12005 |
| 9,922,699 B1 | 3/2018 | Sinangil et al. | |
| 11,094,395 B2 * | 8/2021 | Nazar | G11C 11/417 |
| 2003/0188241 A1 | 10/2003 | Zyuban et al. | |
| 2008/0062802 A1 | 3/2008 | Lin et al. | |
| 2010/0260001 A1 | 10/2010 | Kasprak et al. | |
| 2014/0210535 A1 * | 7/2014 | Bartling | G11C 14/0072 327/199 |

(Continued)

*Primary Examiner* — Min Huang
(74) *Attorney, Agent, or Firm* — Kowert, Hood, Munyon, Rankin & Goetzel, P.C.; Scott W. Pape; Dean M. Munyon (57) ABSTRACT

An apparatus includes a memory circuit that includes a plurality of sub-arrays. The memory circuit is configured to implement a retention mode according to test information indicating voltage sensitivities for the plurality of sub-arrays. The apparatus also includes a voltage control circuit coupled to a power supply node. The voltage control circuit is configured, in response to activation of the retention mode for the plurality of sub-arrays, to generate, based on the test information, at least two different retention voltage levels for different ones of the plurality of sub-arrays. The at least two different retention voltage levels are lower than a power supply voltage level of the power supply node.

20 Claims, 8 Drawing Sheets

(56) References Cited

U.S. PATENT DOCUMENTS

2015/0106671 A1\* 4/2015 Guo ................ G11C 29/50016
             714/721
2018/0068713 A1   3/2018 Deng et al.
2019/0128959 A1   5/2019 Moon \* cited by examiner

| Test Information 420 | | | | | | | | | |
|---|---|---|---|---|---|---|---|---|---|
| indicator | 0 | 1 | 2 | 3 | 4 | 5 | 6 | ... | n |
| value | 1 | 0 | 0 | 0 | 1 | 0 | 0 | | 0 |

| Test Information 424 | | | | | | | | | |
|---|---|---|---|---|---|---|---|---|---|
| indicator | 0 | | | 1 | | | ... | n | |
| value | 0 | 0 | 0 | 0 | 1 | 0 | | 0 | 0 | 1 |

RETENTION VOLTAGE MANAGEMENT FOR A VOLATILE MEMORY

PRIORITY CLAIM

The present application is a continuation of U.S. application Ser. No. 16/677,470, filed Nov. 7, 2019 (now U.S. Pat. No. 11,094,395), which is incorporated by reference herein in its entirety.

BACKGROUND

Technical Field

Embodiments described herein are related to the field of integrated circuits, and more particularly to management of power signals to sub-arrays of a memory.

Description of the Related Art

Computer systems, including integrated circuits (IC), such as a systems-on-chip (SoCs), include one or more types of memory used for temporary and long-term storage of information. Volatile memories, such as static random-access memory (SRAM) and dynamic random-access memory (DRAM), may lose stored information when their power is disabled or a voltage level of their power signal falls below a particular voltage level. To reduce power consumption, a computer system may place one or more functional circuits into a reduced power mode, which may, in some cases, include reducing a voltage level of one or more power signals. A computer system that includes volatile memory may enable a retention mode for some or all included volatile memories to retain any data stored in these memories when a voltage level of a power supply for the memory is below an operating voltage level. In a retention mode, the data storage cells may not be read or written, but may receive an adequate power signal, referred to herein as a "retention signal," to prevent loss of data from the data storage cells.

SUMMARY OF THE EMBODIMENTS

Broadly speaking, a system, an apparatus, and a method are contemplated in which the apparatus may include a memory circuit that includes a plurality of sub-arrays. The memory circuit may be configured to implement a retention mode according to test information indicating voltage sensitivities for the plurality of sub-arrays. The apparatus may also include a voltage control circuit coupled to a power supply node. The voltage control circuit may be configured, in response to activation of the retention mode for the plurality of sub-arrays, to generate, based on the test information, at least two different retention voltage levels for different ones of the plurality of sub-arrays. The at least two different retention voltage levels are lower than a power supply voltage level of the power supply node.

In a further example, the test information may include an indication that one or more voltage sensitive data storage cells are included in a particular sub-array. Voltage sensitive data storage cells may include data storage cells that fail to retain data at a lowest of the at least two different retention voltage levels In one example, the indication may correspond to a minimum voltage level at which one or more of the voltage sensitive data storage cells can retain data in the retention mode.

In another example, the apparatus may further comprise a fuse memory configured to store the test information. At least one fuse circuit in the fuse memory may be configured to store test information for a particular one of the plurality of sub-arrays.

In an embodiment, the apparatus may further comprise a particular set of transconductance devices, each with a different transconductance property, coupled to a power node of a particular one of the plurality of sub-arrays. To generate a particular one of the at least two different retention voltage levels, the voltage control circuit may be configured to enable a particular one of the particular set of transconductance devices.

In a further embodiment, the apparatus may further comprise a different set of transconductance devices, each transconductance device of the different set having the same transconductance properties as a respective one of the particular set of transconductance devices, coupled to a power node of a different one of the plurality of sub-arrays. To generate a different one of the at least two different retention voltage levels, the voltage control circuit may be configured to enable a different one of the different set of transconductance devices. The enabled transconductance device of the different set may have different transconductance properties than the enabled transconductance device of the particular set. In another example, the particular set of transconductance devices may include a standard voltage threshold transistor and a low voltage threshold transistor.

BRIEF DESCRIPTION OF THE DRAWINGS

The following detailed description makes reference to the accompanying drawings, which are now briefly described.

While the disclosure is susceptible to various modifications and alternative forms, specific embodiments thereof are shown by way of example in the drawings and will herein be described in detail. It should be understood, however, that the drawings and detailed description thereto are not intended to limit the disclosure to the particular form illustrated, but on the contrary, the intention is to cover all modifications, equivalents and alternatives falling within the spirit and scope of the present disclosure as defined by the appended claims. As used throughout this application, the word "may" is used in a permissive sense (i.e., meaning having the potential to), rather than the mandatory sense (i.e., meaning must). Similarly, the words "include," "including," and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. § 112, paragraph (f) interpretation for that unit/circuit/component. More generally, the recitation of any element is expressly intended not to invoke 35 U.S.C. § 112, paragraph (f) interpretation for that element unless the language "means for" or "step for" is specifically recited.

As used herein, the term "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. The phrase "based on" is thus synonymous with the phrase "based at least in part on."

DETAILED DESCRIPTION OF EMBODIMENTS

One or more volatile memory circuits, such as SRAM and DRAM may be used in computing systems, including SoCs, for storage of instructions and/or data. If a particular memory circuit is not currently being accessed, or if a portion of the computer system that includes or utilizes the memory circuit is being placed into a reduced power mode, then the particular memory circuit may be placed into a retention mode. As used herein, a "retention mode" is a mode for a volatile memory that allows the memory circuit to retain the information that has been stored while reducing an amount of power the circuit utilizes. As part of the retention mode, a voltage level of a power signal received by the circuit may be lowered as part of the power reduction. A given data storage cell of a volatile memory circuit has a minimum voltage level at which stored information may be retained, referred to herein as a "minimum retention voltage." If the voltage level of the power signal falls below the minimum retention voltage, then the information stored in the given data storage cell may be lost. Typically, most data storage cells in the particular memory circuit have a similar minimum retention voltage level, allowing, in some cases, for the data storage cells to be supplied with power from a same power signal that satisfies this minimum retention voltage level.

Variations between the data storage cell circuits of a memory circuit, such as manufacturing defects, may allow a data storage cell to remain functional for storing and reading information, but may have an adverse effect on the minimum retention voltage level of the data storage cell. As a result, a memory circuit may have a typical minimum retention voltage level, e.g., 400 millivolts (mV), for the majority of the data storage cells, but a few defective cells may be limited to a higher minimum retention voltage level, e.g., 600 mV. If all the data storage cells in the memory circuit are coupled to the same retention signal, then the voltage level for this retention signal may be set to 600 mV to avoid losing information stored in the defective data storage cells. This higher retention voltage level may result in more power being consumed just to protect information stored in a few data storage cells.

The present disclosure describes embodiments for managing retention voltage levels for data storage cells in a volatile memory circuit. One such embodiment includes a voltage control circuit that is coupled to a power supply node and a memory circuit that includes a plurality of sub-arrays. The voltage control circuit is configured to, in response to activation of a retention mode for the memory circuit, generate, at least two different retention voltage levels (each less than a voltage level of the power supply node) for different ones of the plurality of sub-arrays. Test information is used by the voltage control circuit to distribute the different voltage levels to the sub-arrays. By managing different retention voltage levels to various sub-arrays, use of a higher retention voltage for defective data storage cells may be limited to sub-arrays that include such defective cells, while sub-arrays without defective cells may receive a lower retention voltage that may, in some embodiments, reduce overall power consumption of a memory circuit in a retention mode.

Circuits described above and herein may, in various embodiments, be implemented using devices corresponding to metal-oxide semiconductor field-effect transistors (MOSFETs), such as fin field-effect transistors (FinFETs), or to any other suitable type of transconductance device. As used and described herein, a "logic low level," or a "logic low," corresponds to a voltage level sufficiently low to enable a p-channel MOSFET, and a "logic high level," or a "logic high," corresponds to a voltage level sufficiently high to enable an n-channel MOSFET. In various other embodiments, different technology, including technologies other than complementary metal-oxide semiconductor (CMOS), may result in different voltage levels for "logic low" and "logic high." A "logic signal," as used herein, may correspond to a signal generated in a CMOS, or other technology, circuit in which the signal transitions between low and high logic levels.

Figure 1:
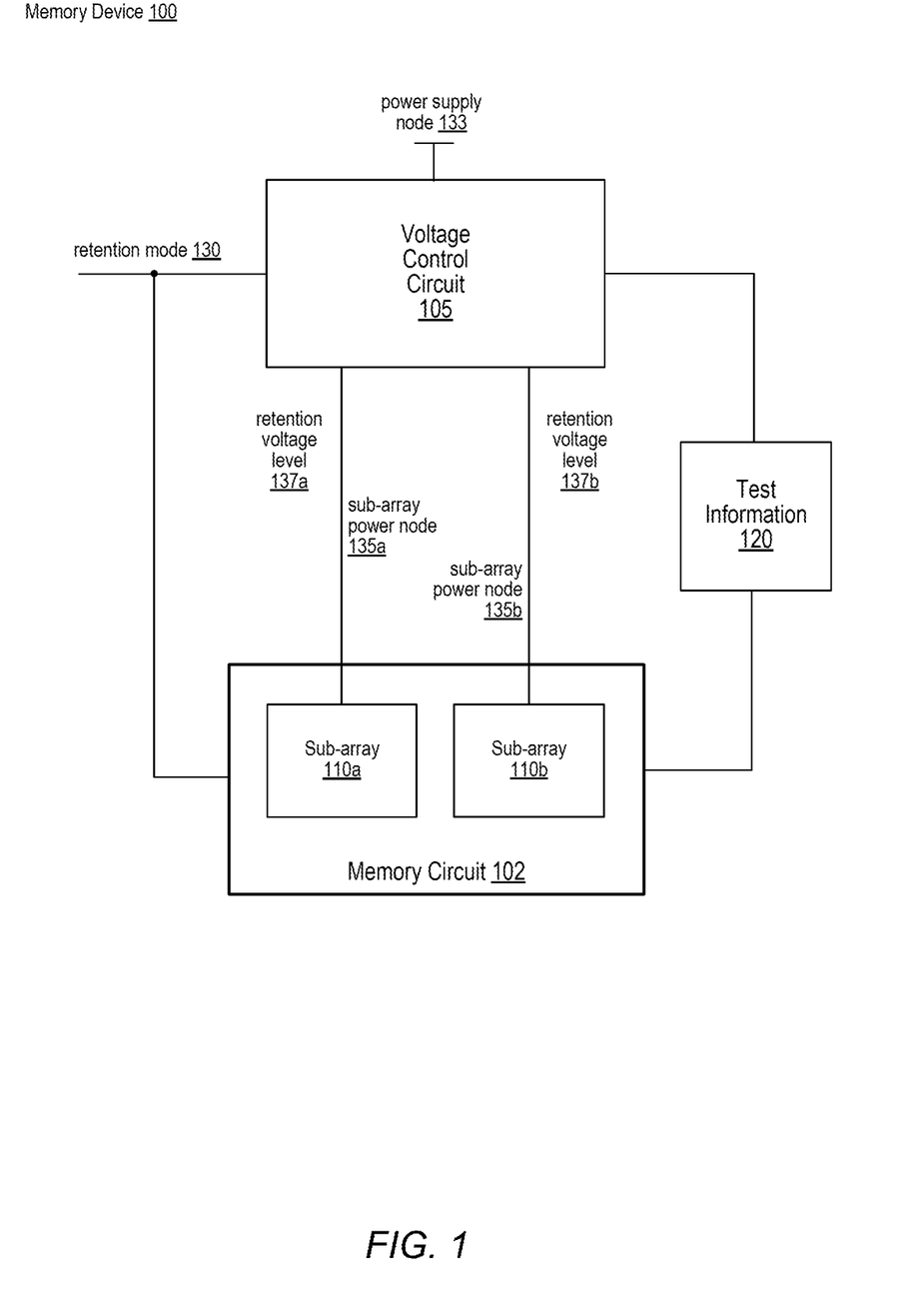
FIG. 1 illustrates a block diagram of an embodiment of a memory device.

A block diagram for an embodiment of a memory device is illustrated in FIG. 1. Memory device 100 may be included in a computing system, including for example, a system-on-chip (SoC). As illustrated, memory device 100 includes memory circuit 102, which further includes sub-arrays 110a and 110b. Memory circuit 102 is coupled to voltage control circuit 105 via sub-array power nodes 135a and 135b. Test information 120 is available to both voltage control circuit 105 and memory circuit 102. In addition, voltage control circuit 105 and memory circuit 102 both receive retention mode signal 130.

Memory circuit 102, in some embodiments, may include one or more standalone memory chips, while in other embodiments, memory circuit 102 may be one of multiple functional circuits included in an SoC. Memory circuit 102 includes a plurality of sub-arrays (110a and 110b, collectively sub-arrays 110), and in some embodiments, may include additional sub-arrays. Each of sub-arrays 110 includes a plurality of volatile data storage cells coupled to a respective one of sub-array power nodes 135a and 135b. Each data storage cell is configured to store one bit of information. For reading and writing data to these data storage cells, voltage control circuit 105 couples a respective sub-array power node 135 for each of sub-arrays 110 to power supply node 133. As long as a voltage level of power supply node 133 is equal to, or greater than, an operational voltage level of the data storage cells, then the data storage cells in sub-arrays 110 may be read or written.

As shown, memory device 100 is configured to implement a retention mode, for example, to reduce power consumption. While memory device 100 is in the retention mode, the data storage cells in sub-arrays 110 may not be read or written, but will retain data that has been previously written to each cell. As disclosed above, a particular data storage cell may retain data in the retention mode as long as a voltage level on the respective sub-array power node 135 is equal to or greater than the retention voltage level for that particular data storage cell, otherwise the stored information may be corrupted and a read value from the cell may not be relied upon. Memory circuit 102 is configured to implement the retention mode according to test information 120 that indicates voltage sensitivities for the plurality of sub-arrays 110.

Voltage control circuit 105, as illustrated, is coupled to power supply node 133. In response to activation of the retention mode for sub-arrays 110, voltage control circuit 105 is configured to generate, based on test information 120, at least two different retention voltage levels (e.g., retention voltage levels 137a and 137b) for different ones of sub-arrays 110. An assertion of retention mode signal 130 indicates activation of the retention mode. In various embodiments, a transition to either a logic high value or a logic low value on retention mode signal 130 may correspond to an assertion. For example, a transition from a logic low to a logic high on retention mode signal 130 may signal an activation of the retention mode. In some embodiments, retention mode signal 130 is generated by another circuit in a computer system that includes memory device 100, such as a processor or a memory controller. In other embodiments, an additional circuit in memory device 100 may generate retention mode signal 130, for example, a state machine control circuit.

In response to the activation, memory circuit 102 may disable read and write circuitry to prevent attempts to access stored information while the retention mode is active. Voltage control circuit 105 decouples sub-array power nodes 135a and 135b from power supply node 133 while generating respective retention voltage levels 137a and 137b on these sub-array power nodes. Based on values in test information 120, voltage control circuit 105 may generate retention voltage level 137a with a higher voltage level than retention voltage level 137b if test information 120 indicates that sub-array 110a includes a voltage sensitive data storage cell while sub-array 110b does not. In some embodiments, both retention voltage levels 137a and 137b may be lower than a voltage level of power supply node 133. In other embodiments, retention voltage level 137b may be equal to the voltage level of power supply node 133.

Test information 120 includes an indication that one or more voltage sensitive data storage cells are included in a particular one of sub-arrays 110. For example, if sub-array 110a is determined to include one or more data storage cells with voltage sensitivity, then test information 120 will include a value that indicates these voltage sensitive data storage cells in sub-array 110b. As used herein, a "voltage sensitive data storage cell" refers to a volatile data storage cell that has a minimum retention voltage level that is higher than a primary retention voltage level. A data value stored in a voltage sensitive data storage cell may, therefore, become corrupted if the retention voltage is reduced to the primary retention voltage level. This primary retention voltage level may vary based on data storage cell design and performance specifications, and therefore the primary retention voltage level may be determined by a circuit designer. In regards to memory device 100, retention voltage level 137b may be the primary retention voltage level while retention voltage level 137a is a secondary retention voltage level selected for use with voltage sensitive data storage cells.

A threshold retention level may be used to determine if a given data storage cell has a voltage sensitivity. For example, in a particular sub-array, a typical data storage cell may have a retention voltage of 500 mV. The threshold retention level may be set at 550 mV to allow for some manufacturing variance among data storage cells in a same sub-array. During a testing operation, the minimum retention voltage level may be determined for each data storage cell in the sub-array, and a corresponding indication is set in the test information if any data storage cell in the sub-array fails to retain data below the threshold retention level.

The indications in test information 120 may, in some embodiments, include a single, respective bit value corresponding to each sub-array 110 in memory circuit 102. If the respective bit is set, then the corresponding sub-array includes at least one voltage sensitive data storage cell. Otherwise, if the respective bit is clear, then no voltage sensitive data storage cells were detected in the testing. In various embodiments, a "set" bit and a "clear" bit may correspond to logic high and logic low values, respectively, or vice versa.

In other embodiments, the indications in test information 120 may include a plurality of respective bit values corresponding to each sub-array 110. These pluralities of bits may be used to indicate a particular retention voltage level to use for the corresponding sub-array. For example, testing may reveal that the minimum retention voltage for all data storage cells in a first sub-array satisfy a first threshold retention level, that the minimum retention voltage for all data storage cells in a second sub-array satisfy a second threshold retention level, higher than the first threshold retention level, and that the minimum retention voltage for all data storage cells in a third sub-array satisfy a third threshold retention level, higher than the second threshold retention level. The indication bit values corresponding to the three sub-arrays may indicate the particular threshold retention level that each sub-array satisfied. In response to an activation of the retention mode, voltage control circuit 105 may generate a different retention voltage level for each sub-array based on the respective indicators in the test information. Such an implementation may allow for a closer matching between the supplied retention voltage level and the needs of the data storage cells in each sub-array.

It is noted that memory device 100 as illustrated in FIG. 1 is merely an example. The illustration of FIG. 1 has been simplified to highlight features relevant to this disclosure. Various embodiments may include different configurations of the circuit blocks, including, for example, additional sub-arrays in the memory circuit.

The memory device illustrated in FIG. 1 includes a voltage control circuit that generates multiple retention voltage signals. Such voltage generation circuits may be implemented using a variety of design techniques. A particular example of how the retention voltage signals may be generated is shown in FIG. 2.

Figure 2:
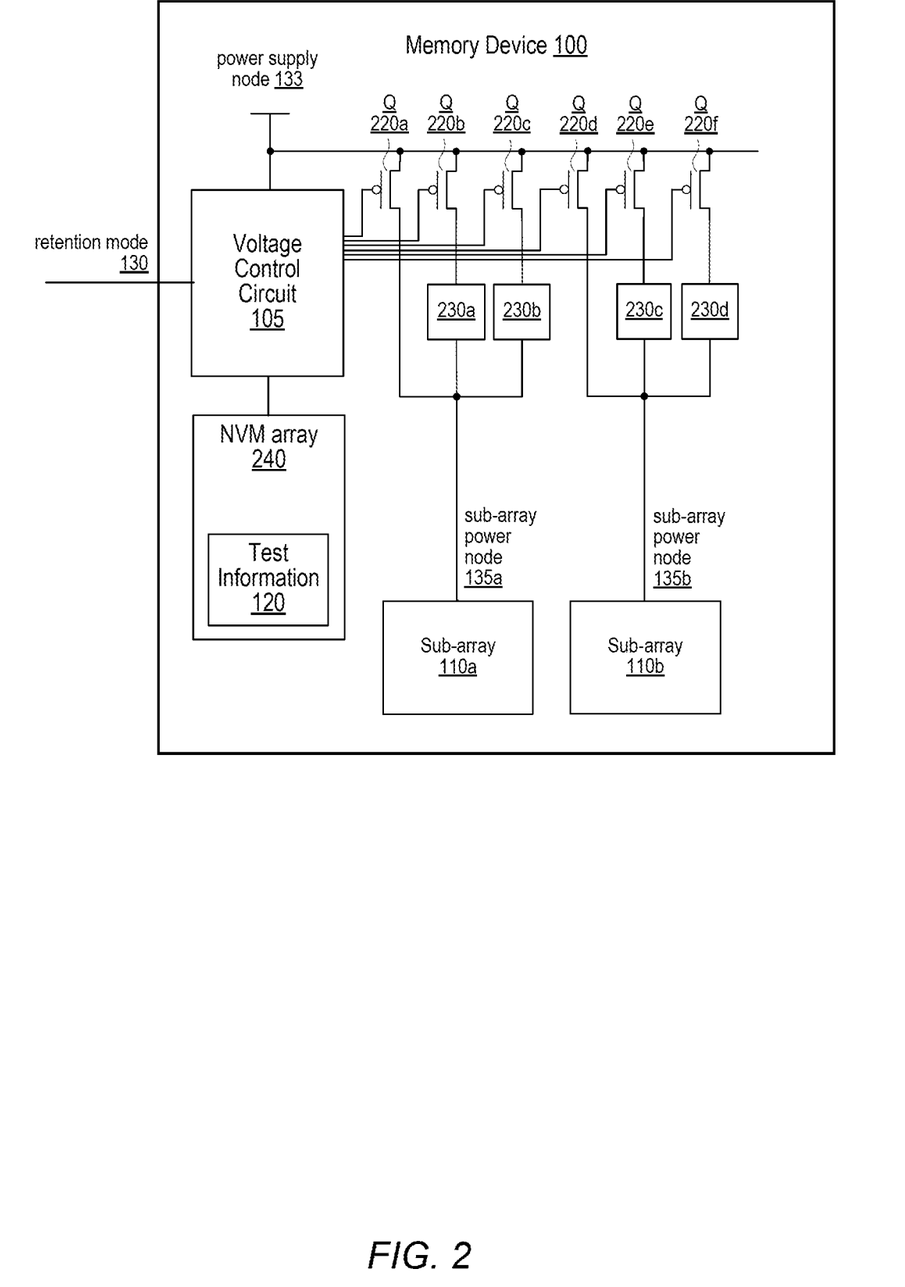
FIG. 2 shows a block diagram of an embodiment of a memory device that includes a non-volatile memory array for storing test information.

Moving to FIG. 2, a block diagram of another embodiment of memory device 100 is shown. As illustrated, memory device 100 includes elements from FIG. 1, including voltage control circuit 105, sub-arrays 110a and 110b, and test information 120. Memory device 100 further includes non-volatile memory (NVM) array 240 for storing test information 120, as well as transconductance devices Q220a-Q220f and impedance circuits 230a-230d. As before, memory device 100 includes power supply node 133 and receives retention mode signal 130.

As illustrated, transconductance devices Q220a-220c are used to generate a particular voltage level on sub-array power node 135a. Transconductance devices Q220a-220f may be implemented as any suitable type of transconductance device. Q220a-Q220f are illustrated herein as n-channel MOSFETs. To generate an operational voltage level, voltage control circuit 105 enables Q220a, thereby coupling sub-array power node 135a to power supply node 133. Such a configuration may allow a voltage level of sub-array power node 135a to reach a same voltage level as power supply node 133.

In response to an assertion of retention mode signal 130, voltage control circuit 105 disables Q220a, thereby decoupling sub-array power node 135a from power supply node 133. To generate a retention voltage level, less than the operational voltage level, on sub-array power node 135a, voltage control circuit 105 enables one or more of Q220b and Q220c, coupling one or both of impedance circuits 230a and 230b to power supply node 133. Voltage control circuit 105 controls the timing for disabling Q220a and enabling one or both of Q220b and Q220c in such a manner to avoid the voltage level of sub-array power node 135a from falling below the desired retention voltage level.

Impedance circuits 230a-230d may be implemented as any suitable circuit elements, or combination of elements, capable of causing a voltage drop between power supply node 133 and sub-array power nodes 135a and 135b. For example, impedance circuits 230a-230d may include resistors, capacitors, diodes, transistors, or a combination thereof. In some embodiments, each of impedance circuits 230a and 230b have different amounts of impedance to generate different voltage levels on sub-array power node 135a when coupled, independently to power supply node 133. In other embodiments, impedance circuits 230a and 230b have substantially the same amount of impedance, such that coupling either impedance circuit 230a or 230b results in a particular retention voltage level on sub-array power node 135a and a different, higher retention voltage level is achieved by coupling both impedance circuits 230a and 230b.

Voltage control circuit 105 uses transconductance devices 220d-220f to generate a particular voltage level on sub-array power node 135b in a similar manner as transconductance devices 220a-220c. In order to generate similar voltage levels on both sub-array power nodes 135a and 135b, impedance circuit 230a has a similar impedance as impedance circuit 230c, and impedance circuit 230b has a similar impedance as impedance circuit 230d. Accordingly, if voltage control circuit 105 enables both Q220b and Q220e (with the other transconductance devices disabled), then sub-array power nodes 135a and 135b will have similar voltage levels, assuming that sub-arrays 110a and 110b have similar power consumption.

By selecting a different combination from Q220a and Q220b and from Q220c and Q220d, voltage control circuit 105 can generate a different voltage level on sub-array power node 135a than on sub-array power node 135b. For example, voltage control circuit 105 may enable Q220b to generate a primary retention voltage level on sub-array power node 135a using impedance circuit 230a, and enable Q220f to generate a secondary retention voltage level on sub-array power node 135b using impedance circuit 230d. If impedance circuit 230d has a lower impedance than impedance circuit 230a, then the secondary retention voltage level will be higher than the primary retention voltage level due to a smaller voltage drop across the lower impedance of impedance circuit 230d than the voltage drop across impedance circuit 230a. In some embodiments, voltage control circuit 105 may enable both Q220b and Q220c (or Q220e and Q220f) to increase a current flow to sub-array power node 135a (or sub-array power node 135b), thereby generating a third retention voltage level that is higher than both the primary retention voltage level and the secondary voltage retention level, but still less than the voltage level of power supply node 133.

To determine which retention voltage level to use for each sub-array, voltage control circuit 105 uses test information 120 stored in NVM array 240. Test information 120, as disclosed above, includes, for each sub-array, an indication if a corresponding sub-array includes one or more voltage sensitive data storage cells. Voltage control circuit 105 selects a particular retention voltage level for a given sub-array based on the corresponding indication.

NVM array 240 may be implemented using any suitable type of non-volatile memory, such as flash memory or electrically-erasable read only memory (EEPROM), that retains the stored test information when power to memory device 100 is disabled. In various embodiments, NVM array 240 may be implemented on a same IC chip as other circuits in memory device 100, or as a different chip communicatively coupled to voltage control circuit 105. In one embodiment, NVM array 240 is a fuse memory configured to store the test information, wherein at least one fuse circuit in the fuse memory is configured to store test information for a particular one on the plurality of sub-arrays. For example, NVM array 240 may include a respective fuse circuit for each sub-array in a memory device. If a particular sub-array is determined to include at least one voltage sensitive data storage cell, then the respective fuse circuit is programmed (also referred to as "blown"). In response to an assertion of retention mode signal 130, voltage control circuit 105 enables a first type of impedance circuit for each sub-array whose respective fuse circuit is not blown, and a second type of impedance circuit, with a lower impedance value, for each sub-array with a corresponding fuse circuit that is blown. Such a use of fuse circuits to store the test information may result in a cost-effective method for storing test information while power is disabled, as well as a storing data in a format that may be read quickly in response to the assertion of the retention mode signal.

It is noted that the embodiment of FIG. 2 is merely an example to demonstrate the disclosed concepts. In other embodiments, a different combination of circuits may be included. For example, in the illustrated embodiment, two impedance circuits are shown for each sub-array. In other embodiments, any suitable number of impedance circuits may be included for each sub-array to allow for generating any particular number of retention voltage levels.

Figure 3:
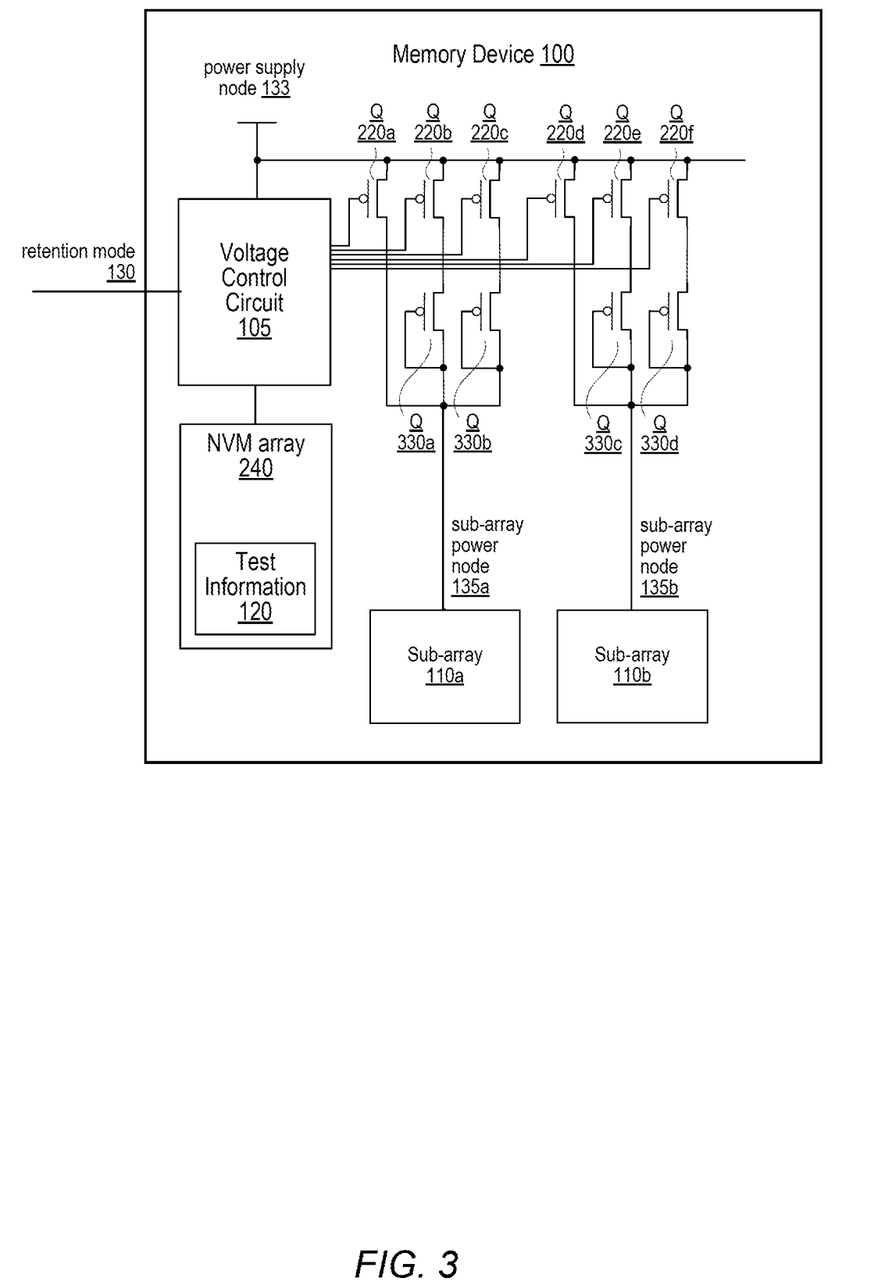
FIG. 3 depicts a block diagram of an embodiment of a memory device that includes sets of transconductance devices for selecting a retention voltage signal.

In the descriptions of memory device 100 in FIG. 2, impedance circuits are described as being used to generate various retention voltage levels for the sub-arrays. FIG. 3 discloses another embodiment of a memory device in which additional transconductance devices are used to generate various retention voltage levels.

Turning to FIG. 3, another embodiment of memory device 100 is illustrated. As shown, memory device 100 includes circuits elements as described above in regards to FIG. 2. In FIG. 3, impedance circuits 230a-230d are illustrated as transconductance devices Q330a-Q330d. Memory device 100, again includes power supply node 133 and receives retention mode signal 130.

As shown, memory device 100 includes a particular set of transconductance devices, each with a different transconductance property, coupled to a power node of a particular one of the plurality of sub-arrays. As used herein a "transconductance property" refers to a characteristic of a transconductance device that determines an amount of current that flows through the device under a given set of conditions. Examples of transconductance properties include channel length, channel width, and/or voltage threshold of a particular transconductance device. The particular set of transconductance devices in memory device 100 includes Q330a-Q330b, with Q330a having one or more properties that are different from Q330b. For example, Q330a may be a standard voltage threshold (SVT) transistor while Q330b is a low voltage threshold (LVT) transistor. In other embodiments, any combination of SVT, LVT, and high voltage threshold (HVT) transistor may be used.

To generate a particular one of at least two different retention voltage levels, voltage control circuit 105 is configured to enable a particular one of the particular set of transconductance devices. Voltage control circuit 105 enables one of Q220a, Q220b, or Q220c to generate a particular voltage level on sub-array power node 135a. In FIG. 3, Q330a and Q330b are implemented in a diode configuration, with the control terminal of each NMOS transistor coupled to its source terminal. Accordingly, a voltage drop occurs across each of Q330a and Q330b when they are active, e.g., when the respective Q220b or Q220c is enabled. By using transconductance devices with different properties, the voltage drop across Q330a is different than the voltage drop across Q330b, resulting in a different retention voltage level on sub-array power node 135a depending on which one of Q220a-Q220c is enabled.

Memory device 100 further includes a different set of transconductance devices, each with similar transconductance properties to a respective one of the particular set of transconductance devices, coupled to a power node of a different one of the plurality of sub-arrays. Transconductance devices Q330c and Q330d are included in this different set. Each of Q330c and Q330d have similar transconductance properties to a corresponding one of Q330a and Q330b. For example, Q330a and Q330c may be HVT transistors while Q330b and Q330d are LVT transistors, resulting in a larger voltage drop across Q330a and Q330c when they are active.

To generate a different one of the at least two different retention voltage levels, the voltage control circuit is configured to enable a different one of the different set of transconductance devices, wherein the different one enabled transconductance device has different transconductance properties than the particular one enabled transconductance device. Returning to the example of the previous paragraph, in response to an assertion of retention mode signal 130, voltage control circuit 105 may enable Q220c to activate Q330b and Q220e to activate Q330c. The LVT properties of Q330b result is a lower voltage drop than the HVT properties of Q330c. With the lower voltage drop across Q330b, the voltage level on sub-array power node 135a is higher than the voltage level on sub-array power node 135b.

In the previous example, voltage control circuit 105 is configured to enable a particular one of a set of transconductance devices to generate a particular voltage level for a given sub-array. In other embodiments, voltage control circuit 105 may enable one or more transconductance devices in a given set in order to generate a particular retention voltage level. Accordingly, to generate a first retention supply signal for a first subset of the plurality of sub-arrays, voltage control circuit 105 is configured to enable a first number of the respective set of transconductance devices coupled to a respective power node of a first a sub-array. Similarly, voltage control circuit 105 is further configured to enable a second number of a respective set of transconductance devices coupled to a respective power node of a second a sub-array, wherein the second number is greater than the first number. For example, voltage control circuit 105 may enable a single transconductance device, e.g., Q220e, to generate a particular retention voltage level on sub-array power node 135b through Q330c. To generate a higher retention voltage level on sub-array power node 135a, voltage control circuit 105 may enable both Q220b and Q220c to activate both Q330a and Q330b.

In such an embodiment, each of transconductance devices Q330a-Q330d may have a particular drain-to-source resistance (also referred to herein as "on resistance") when enabled. This on resistance may be the same for all of Q330a-Q330d, or may vary within a given set, such that Q330a and Q330c have similar on resistance while Q330b and Q330d have a different on resistance from Q330a and Q330c. By selecting different combinations of Q330a and Q330b, a resistance between power supply node 133 and sub-array power node 135 may be varied to generate different voltage drops, and therefore, different retention voltage levels on sub-array power node 135a. In a similar manner, a particular combination of Q330c and Q330d may be activated to generate a particular retention voltage level on sub-array power node 135b.

It is noted that FIG. 3 shows an example embodiment of a memory device. Variations of the illustrated embodiment are contemplated. For example, other embodiments may include additional sub-arrays, with a different number of transconductance devices included for each sub-array.

Figure 4:
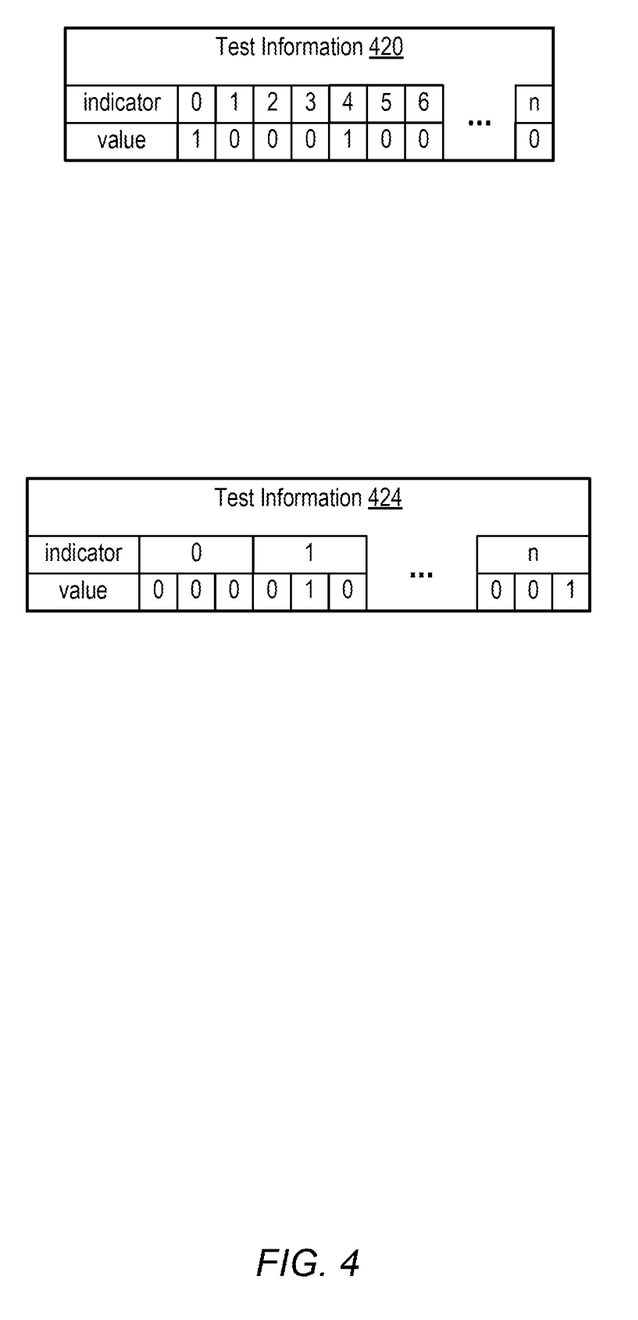
FIG. 4 illustrates two tables of test information used in a memory device.

In the descriptions of memory device 100 in FIGS. 1-3, test information is described as being used to determine a particular retention voltage level for each sub-array. FIG. 4 depicts two embodiments of test information that may be used for determining retention voltage levels.

Proceeding to FIG. 4, two tables are illustrated, depicting test information used in a memory device. As shown, test information 420 and test information 424 illustrate how test information 120 may be stored in NVM array 240. Each table includes a value corresponding to an enumerated indicator.

As depicted, test information 420 utilizes a single bit for each indicator 0 to n, where "n" is the total number of sub-arrays, minus one, in the memory device. Each indicator has a value of "0" or "1." In some embodiments, a value of "0" may indicate that the corresponding sub-array does not include any voltage sensitive data storage cells, while a value of "1," in contrast, indicates a presence of at least one voltage sensitive data storage cell in the corresponding sub-array. The polarity of the value may be swapped in other embodiments. Using test information 420, voltage control circuit 105 may generate a first retention voltage level for a particular sub-array if the value of the corresponding indicator is "0," and a second, higher, retention voltage level if the value of the corresponding indicator is "1."

Test information 424, as shown, includes three bits for each indicator 0-n. By using additional bits for each indicator, additional information may be available to voltage control circuit 105. For example, an indication of a number of voltage sensitive bit cells in the corresponding sub-array may be stored. The value of "000" in indicator 0 may denote that zero data storage cells in sub-array 110a are voltage sensitive while the value of "010" in indicator 1 may denote that two "groups" of data storage cells in sub-array 110b include voltage sensitive data storage cells. A size of a "group" may vary depending on a size of a sub-array and a number of bits used in each indicator.

In other embodiments of test information 424, the multiple bits may be used to indicate different information. For example, the multiple bits may be used to indicate a minimum retention voltage level that may be used for the corresponding sub-array, or may indicate which of a plurality of retention voltage levels are to be used for the corresponding sub-array. For example, the value of "000" in indicator 0 may instruct voltage control circuit 105 to use a default retention voltage level for sub-array 110a, while the value of "010" in indicator 1 may instruct voltage control circuit 105 to use a second alternative retention voltage level of a plurality of alternative retention voltage levels. In some embodiments, each bit of a given indicator may correspond to a particular transconductance device that is to be enabled in response to an assertion of the retention mode signal. Furthermore, the bits of an indicator may denote both an indication of a number of voltage sensitive data storage cells and a particular retention voltage that is to be used for the corresponding sub-array.

It is noted that the embodiments shown in FIG. 4 are merely examples. Although indicators of a single bit and of three bits are shown, any suitable number of bits may be included for each indicator.

The memory devices described above in FIGS. 1-3 may manage retention voltages using a variety of methods. One such method for generating retention voltage levels for sub-arrays in a memory device is described in FIG. 5.

Figure 5:
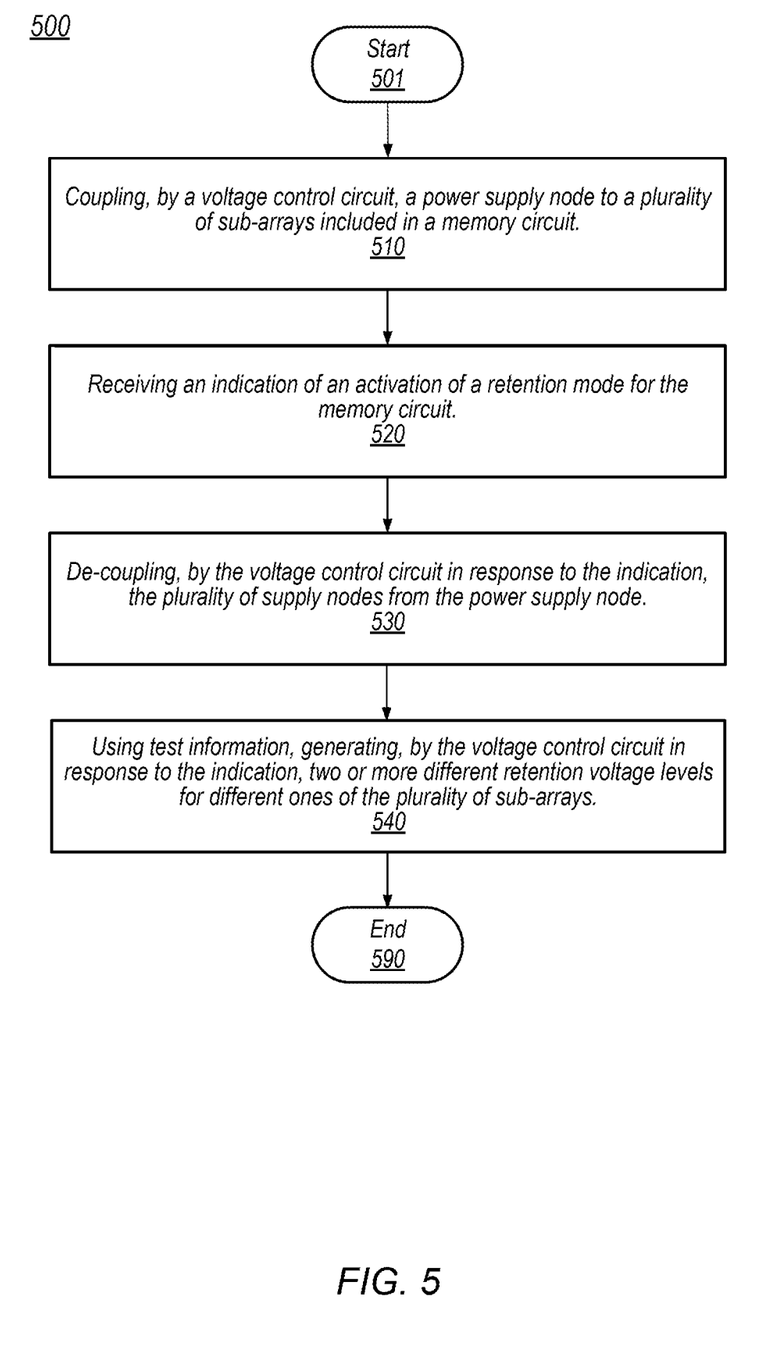
FIG. 5 shows a flow diagram of an embodiment of a method for enabling retention voltage levels for a plurality of memory sub-arrays in a memory device.

Turning now to FIG. 5, a flow diagram for an embodiment of a method for managing retention voltage levels in a memory device is shown. Method 500 may be performed by a memory device, for example, memory device 100 in FIGS. 1, 2, and 3. Referring collectively to FIGS. 3 and 5, method 500 begins in block 501.

Method 500 includes, at block 510, coupling, by a voltage control circuit, a power supply node to a plurality of sub-arrays included in a memory circuit. As illustrated in FIG. 3, voltage control circuit 105 enables transconductance devices Q220a and Q220d to couple sub-arrays 110a and 110b, respectively, to power supply node 133. Voltage control circuit 105 enables additional transconductance devices to couple respective additional sub-arrays of the plurality of sub-arrays to power supply node 133. Coupling sub-arrays 110a and 110b to power supply node 133 via Q220a and Q220d results in an operational voltage level being generated on sub-array power nodes 135a and 135b. With the operational voltage level on sub-array power nodes 135a and 135b, sub-arrays 110a and 110b may perform read and write transactions.

At block 520, the method includes receiving an indication of an activation of a retention mode for the memory circuit. Voltage control circuit 105 receives retention mode signal 130, as shown in FIG. 3. An assertion of retention mode signal 130 indicates that memory device 100 is to transition into the retention mode. In the retention mode, sub-arrays 110a and 110b may retain stored information, but cannot perform read and write transactions.

Method 500 further includes, at block 530, de-coupling, by the voltage control circuit in response to the indication, the plurality of sub-arrays from the power supply node. After detecting the assertion of retention mode signal 130, voltage control circuit 105 disables Q220a and Q220d, thereby decoupling respective paths from sub-array power nodes 135a and 135b to power supply node 133.

At block 540, method 500 includes, using test information, generating, by the voltage control circuit in response to the indication, two or more different retention voltage levels for different ones of the plurality of sub-arrays. The at least two different retention voltage levels are lower than a power supply voltage level of the power supply node. As illustrated, voltage control circuit accesses test information 120 that is stored in NVM array 240. Test information 120 includes values corresponding to each sub-array in memory device 100, including sub-arrays 110a and 110b, each value indicating, when set, that the corresponding sub-array includes one or more voltage sensitive data storage cells. Based on these indications in test information 120, voltage control circuit 105 generates a particular retention voltage level from the at least two different retention voltage levels for each sub-array in memory device 100.

Using the transconductance devices, voltage control circuit 105 generates a first retention voltage level of the two or more different retention voltage levels for ones of the plurality of sub-arrays for which the corresponding indication is not set, and generates at least a second retention voltage level of the two or more different retention voltage levels for ones of the plurality of sub-arrays for which the corresponding indication is set. The first retention voltage level is less than other ones of the two or more different retention voltage levels. For example, a voltage level of power supply node may be 1200 millivolts (mV). The first retention voltage level may be 600 mV, for use with the sub-arrays that do not include voltage sensitive data storage cells. The second retention voltage level may be 800 mV, for use with sub-arrays that are indicated to include voltage sensitive data storage cells. This higher retention voltage of 800 mV may be adequate for the voltage sensitive data storage cells to retain their information while in the retention mode. The method ends in block 590.

In some embodiments, voltage control circuit 105 generates the first retention voltage level by enabling a particular device of a first set of transconductance devices, and generating the second retention voltage level by enabling a different device of a second set of transconductance devices, wherein the particular device has different transconductance properties than the different device. As shown in FIG. 3, Q220a, Q220b, Q220c, Q330a and Q330b comprise a first set of transconductance devices, while Q220d, Q220e, Q220f, Q330c and Q330d comprise a second set. Voltage control circuit 105 may enable Q220b to activate Q330a and enable Q220f to activate Q330d. To generate different voltage levels, Q330a has different transconductance properties than Q330d (e.g., Q330a is an SVT transistor and Q330d is an LVT transistor). These different properties result in a larger voltage drop across Q330a than across Q330d, thereby generating a lower retention voltage on sub-array power node 135a than on sub-array power node 135b.

In other embodiments, voltage control circuit 105 generates the first retention voltage level by enabling a first number of the first set of transconductance devices, and generating the second retention voltage level by enabling a second number of the second set of transconductance devices, wherein the first number is less than the second number. For example, to generate the first voltage level, voltage control circuit 105 may enable Q220b of the first set of transconductance devices, resulting in a voltage level of sub-array power node 135a that is dependent on the voltage drop across Q330a. Voltage control circuit 105 may also enable Q220e and Q220f of the second set of transconductance devices, resulting in a voltage level of sub-array power node 135b that is dependent on the voltage drop across both Q330c and Q330d. An amount of resistance through Q330c and Q330d, arranged in parallel, is less than an amount of resistance through Q330a. The voltage drop across Q330a, therefore, is greater than the voltage drop across Q330c and Q330d in parallel, resulting in a lower retention voltage level on sub-array power node 135a than on sub-array power node 135b.

It is noted that although block 530 is described before block 540, these two blocks may be performed in any suitable order, including simultaneously. A suitable voltage level is maintained at the respective power nodes for the plurality of sub-arrays to avoid loss of information stored in the data storage cells of the sub-arrays. In some embodiments, a suitable amount of capacitance may be present on the sub-array power nodes such that voltage control circuit 105 may decouple the sub-array power nodes from the power supply node before generating the respective retention voltage levels. In other embodiments, voltage control circuit 105 may begin generating the retention voltage levels before decoupling the power supply node. For example, voltage control circuit 105 may enable Q220b before disabling Q220a.

Figure 6:
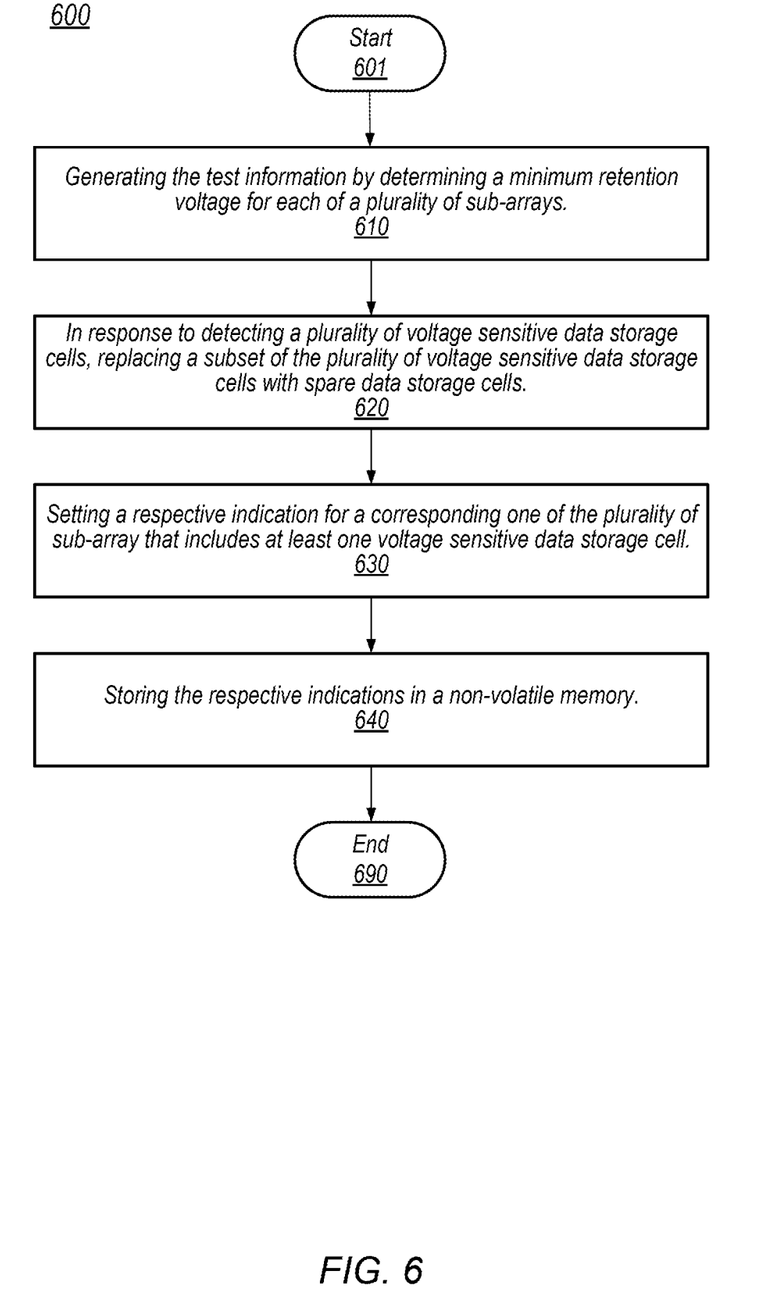
FIG. 6 illustrates a flow diagram of an embodiment of a method for generating test information for a plurality of memory sub-arrays in a memory device.

As described above, method 500 includes generating various retention voltage levels with the use of test information. Test information may be generated using a variety of techniques. Method 600 describes one such technique for collecting test information on a memory device.

Moving now to FIG. 6, a flow diagram of a method for generating test data for sub-arrays in a memory device is illustrated. Method 600 may be performed by a test system on a memory device such as memory device 100 in FIGS. 1, 2, and 3. In some embodiments, method 600 is performed prior to method 500 in FIG. 5. For example, method 600 may be performed as part of a manufacturing flow of a computing device that includes one or more instances of memory device 100. Referring collectively to FIGS. 3 and 6, method 600 begins in block 601.

At block 610, method 600 includes, generating the test information by determining a minimum retention voltage for each of a plurality of sub-arrays. In an embodiment, a computing device that includes memory device 100 is coupled to a test interface that allows a tester to access memory device 100. The tester controls, directly or indirectly, a voltage level on a sub-array power node for each sub-array included in the memory device. The tester is further be capable of initiating memory requests to read and write data to each sub-array. In some embodiments, the tester initiates a built-in self-test (BIST) that causes a BIST engine to perform various operations involved in generating the test information.

To generate test information related to retention mode for a particular sub-array, such as sub-array 110a, the tester sends instructions to memory device 100 to fill the data storage cells of sub-array 110a with a known data pattern. The tester then initiates an assertion of retention mode signal 130 and initiates application of a particular retention voltage level on sub-array power node 135a. After a given amount of time, the tester initiates an end to the retention mode and return to an operational voltage level on sub-array power node 135a. The tester reads the data stored in the data storage cells of sub-array 110a and compares the read data to the known pattern. Any bit of data that does not match the known pattern may be indicative of a voltage sensitive data storage cell. In some embodiments, this process may be repeated for a number of retention voltage levels and/or a number of different known data patterns. The tester maintains the results of the retention mode test, tracking sub-arrays in which one or more voltage sensitive data storage cells are detected.

Method 600 further includes, at block 620, in response to detecting a plurality of voltage sensitive data storage cells, replacing a subset of the plurality of voltage sensitive data storage cells with spare data storage cells. In some embodiments, memory device 100 includes one or more spare data storage cells. An identified voltage sensitive data storage cell may be replaced in one or more sub-arrays in which a voltage sensitive data storage cell is detected. In some embodiments, replacing a data storage cell includes replacing an entire row or column of data storage cells with a spare row or column of cells. Replacing a row or column commits all cells of the spare row or column to the row or column being replaced. Any suitable process may be utilized to determine which voltage sensitive data storage cells are replaced. For example, data storage cells that have the highest retention voltage level may be replaced first, potentially lowering a worst-case retention voltage level for memory device 100. If the number of detected voltage sensitive data storage cells is less than a number of available spare data storage cells, then method 600 may skip block 630 and proceed instead to operation 640. Otherwise, if voltage sensitive data storage cells remain after all available spare data storage cells have been used, then the method proceeds to block 630.

At block 630 method 600 further includes setting a respective indication for a corresponding one of the plurality of sub-array that includes at least one voltage sensitive data storage cell. The tester generates test information 120 by setting a particular value for each sub-array in which one or more voltage sensitive data storage cells remains. In some embodiments, the value comprises a single bit indicating whether the corresponding sub-array includes at least one voltage sensitive data storage cell. In other embodiments, the value may indicate a number of data storage cells that are voltage sensitive or a particular one of a plurality of retention voltage levels to be used for the corresponding sub-array.

Method 600 also includes, at block 640, storing the respective indications in a non-volatile memory. After the tester compiles test information 120, the tester initiates storage of test information 120 into NVM array 240. In some embodiments, NVM array 240 is implemented as an array of fuse circuits. In such embodiments, the tester causes the fuses to be blown in a manner that encodes test information 120 for use by voltage control circuit 105. In other embodiments, flash memory or EEPROM may be used for long-term storage of test information 120. The method ends in block 690.

It is noted that methods 500 and 600 of FIGS. 5 and 6 are merely examples. Variations of the disclosed methods are contemplated. For example, operations 610 and 530 and 540 of method 500 are illustrated as occurring serially. In other embodiments, operations 530 and 540 may be performed in the opposite order or in parallel. Operation 620 of method 600 may, in some embodiments, be omitted.

FIGS. 1-6 illustrate apparatus and methods for managing retention voltage levels in a memory device. Memory devices, such as those described above, may be used in a variety of computer systems, such as a desktop computer, laptop computer, smartphone, tablet, wearable device, and the like. Other types of computer systems may include smart-home appliances such as virtual assistant devices, smart televisions, smart thermostats, and other devices supporting the Internet of Things (IoT) connectivity. In some embodiments, the circuits described above may be implemented on a system-on-chip (SoC) or other type of integrated circuit.

Figure 7:
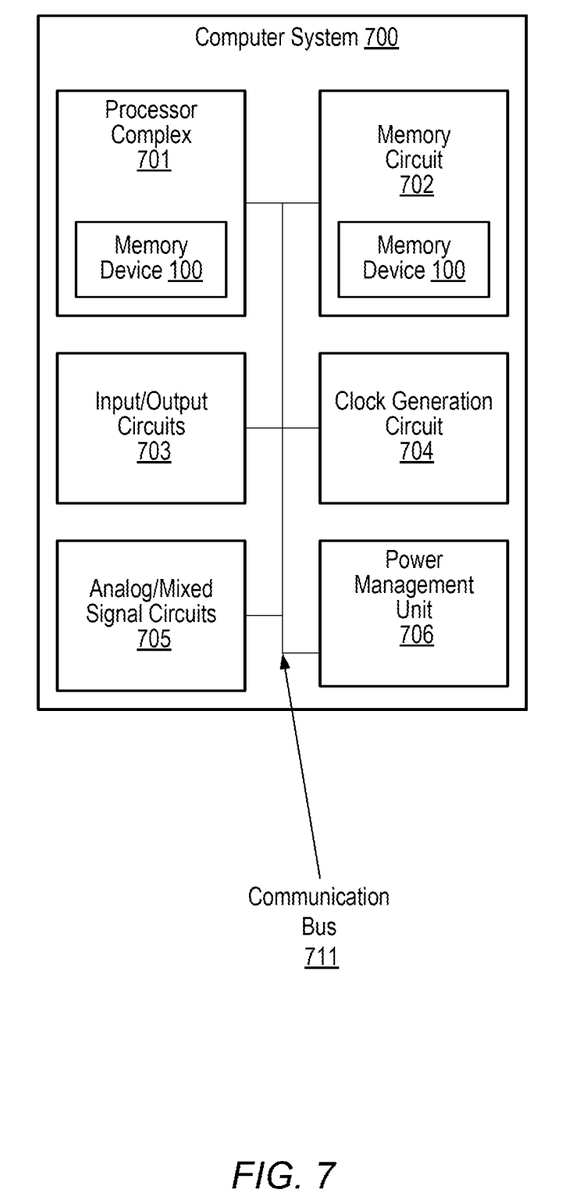
FIG. 7 depicts a block diagram of an embodiment of a computer system, according to some embodiments.

A block diagram illustrating an embodiment of computer system 700 that includes the disclosed circuits is illustrated in FIG. 7. As shown, computer system 700 includes processor complex 701, memory circuit 702, input/output circuits 703, clock generation circuit 704, analog/mixed-signal circuits 705, and power management unit 706. These functional circuits are coupled to each other by communication bus 711. As shown, processor complex 701 and/or memory circuit 702 may include respective embodiments of memory device 100.

Processor complex 701, in various embodiments, may be representative of a general-purpose processor that performs computational operations. For example, processor complex 701 may be a central processing unit (CPU) such as a microprocessor, a microcontroller, an application-specific integrated circuit (ASIC), or a field-programmable gate array (FPGA). In some embodiments, processor complex 701 may correspond to a special purpose processing core, such as a graphics processor, audio processor, or neural processor, while in other embodiments, processor complex 701 may correspond to a general-purpose processor configured and/or programmed to perform one such function. Processor complex 701, in some embodiments, may include a plurality of general and/or special purpose processor cores as well as supporting circuits for managing, e.g., power signals, clock signals, and memory requests. In addition, processor complex 701 may include one or more levels of cache memory to fulfill memory requests issued by included processor cores.

Memory circuit 702, in the illustrated embodiment, includes one or more memory circuits for storing instructions and data to be utilized within computer system 700 by processor complex 701. In various embodiments, memory circuit 702 may include any suitable type of memory such as a dynamic random-access memory (DRAM), a static random access memory (SRAM), a read-only memory (ROM), electrically erasable programmable read-only memory (EEPROM), or a non-volatile memory, for example. It is noted that in the embodiment of computer system 700, a single memory circuit is depicted. In other embodiments, any suitable number of memory circuits may be employed. In some embodiments, memory circuit 702 may include a memory controller circuit as well as communication circuits for accessing memory circuits external to computer system 700.

Input/output circuits 703 may be configured to coordinate data transfer between computer system 700 and one or more peripheral devices. Such peripheral devices may include, without limitation, storage devices (e.g., magnetic or optical media-based storage devices including hard drives, tape drives, CD drives, DVD drives, etc.), audio processing subsystems, or any other suitable type of peripheral devices. In some embodiments, input/output circuits 703 may be configured to implement a version of Universal Serial Bus (USB) protocol or IEEE 1394 (Firewire®) protocol.

Input/output circuits 703 may also be configured to coordinate data transfer between computer system 700 and one or more devices (e.g., other computing systems or integrated circuits) coupled to computer system 700 via a network. In one embodiment, input/output circuits 703 may be configured to perform the data processing necessary to implement an Ethernet (IEEE 802.3) networking standard such as Gigabit Ethernet, for example, although it is contemplated that any suitable networking standard may be implemented.

Clock generation circuit 704 may be configured to enable, configure and manage outputs of one or more clock sources. In various embodiments, the clock sources may be located in analog/mixed-signal circuits 705, within clock generation circuit 704, in other blocks with computer system 700, or come from a source external to computer system 700, coupled through one or more I/O pins. In some embodiments, clock generation circuit 704 may be capable of enabling and disabling (e.g., gating) a selected clock source before it is distributed throughout computer system 700. Clock generation circuit 704 may include registers for selecting an output frequency of a phase-locked loop (PLL), delay-locked loop (DLL), frequency-locked loop (FLL), or other type of circuits capable of adjusting a frequency, duty cycle, or other properties of a clock or timing signal.

Analog/mixed-signal circuits 705 may include a variety of circuits including, for example, a crystal oscillator, PLL or FLL, and a digital-to-analog converter (DAC) (all not shown) configured to generated signals used by computer system 700. In some embodiments, analog/mixed-signal circuits 705 may also include radio frequency (RF) circuits that may be configured for operation with cellular telephone networks. Analog/mixed-signal circuits 705 may include one or more circuits capable of generating a reference voltage at a particular voltage level, such as a voltage regulator or band-gap voltage reference.

Power management unit 706 may be configured to generate a regulated voltage level on a power supply signal for processor complex 701, input/output circuits 703, memory circuit 702, and other circuits in computer system 700. In various embodiments, power management unit 706 may include one or more voltage regulator circuits, such as, e.g., a buck regulator circuit, configured to generate the regulated voltage level based on an external power supply (not shown). In some embodiments any suitable number of regulated voltage levels may be generated. Additionally, power management unit 706 may include various circuits for managing distribution of one or more power signals to the various circuits in computer system 700, including maintaining and adjusting voltage levels of these power signals.

It is noted that the embodiment illustrated in FIG. 7 includes one example of a computer system. A limited number of circuit blocks are illustrated for simplicity. In other embodiments, any suitable number and combination of circuit blocks may be included. For example, in other embodiments, security and/or cryptographic circuit blocks may be included.

Figure 8:
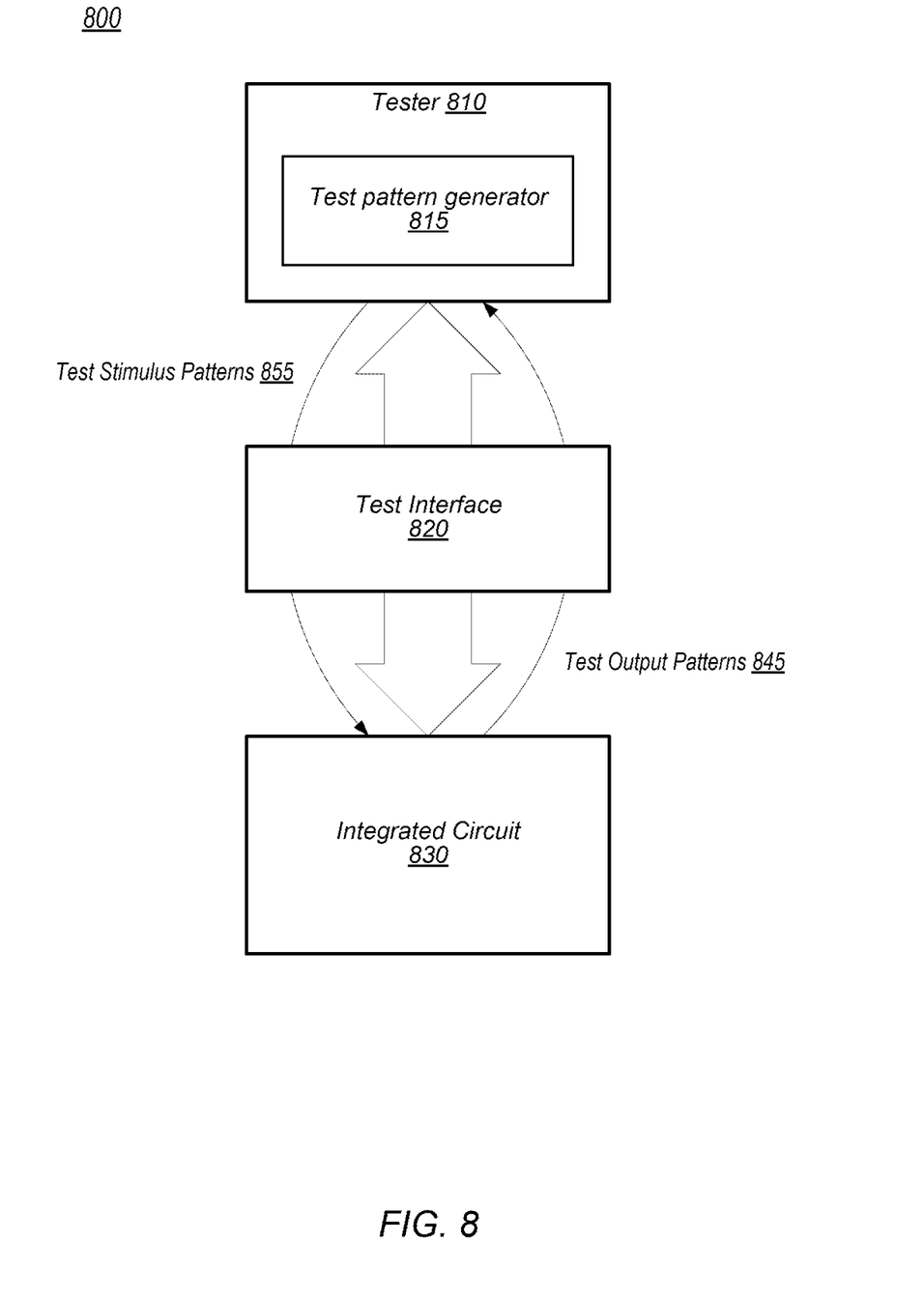
FIG. 8 shows a block diagram of an embodiment of a testing system for generating test information.

Proceeding now to FIG. 8, a block diagram for an embodiment of a test system is depicted. Test system 800 is an example of a test system that is capable of implementing method 600 in FIG. 6. Test system 800 includes tester 810 which may be used to perform a variety of tests operations on integrated circuit 830, via test interface 820. Tester 810 includes test pattern generator 815, and, as illustrated, integrated circuit 830 includes at least one instantiation of memory device 100.

Tester 810, as shown, includes hardware and software that may be used to perform test operations on integrated circuit 830. In some embodiments, tester 810 may be a collection of electronic equipment such as power supplies, clock generators, logic analyzers, pattern generators, and other such equipment that may be used in a laboratory environment to perform evaluations, characterizations, and/or circuit validation tests on integrated circuit 830. In other embodiments, tester 810 may correspond to automated test equipment (ATE) used to test a plurality of fabricated integrated circuits 830 in a manufacturing environment before the integrated circuits 830 are sold to a customer or assembled into other products.

Test pattern generator 815 includes hardware and software for generating test stimulus patterns 855 to be applied to integrated circuit 830. Test pattern generator 815 generates test stimulus patterns 855 with particular voltage levels to be applied to integrated circuit 830. Test interface 820 includes hardware for electronically coupling tester 810 to integrated circuit 830. For example, test interface 820 may include a first physical interface used to attach to tester 810 as well as a second physical interface used to connect to a particular chip package for integrated circuit 830. Test interface 820 may further include one or more components for reducing electronic interference or otherwise improving a quality of test stimulus patterns generated by tester 810.

Test stimulus patterns 855 generated by test pattern generator 815 cause integrated circuit 830 to enter a particular mode that may be used for testing or evaluating a functionality of integrated circuit 830. For example, test stimulus patterns 855 may cause memory device to activate and perform the operations described in method 600. In response to test stimulus patterns 855, integrated circuit 830 may generate test output patterns 845. Test output patterns 845 include one or more signals that are sent, via test interface 820, to tester 810. In various embodiments, test output patterns 845 may be used to make a pass/fail judgement of integrated circuit 830, to determine a particular level of performance achievable by integrated circuit 830, or to retrieve other operational information from integrated circuit 830.

It is also noted that, to improve clarity and to aid in demonstrating the disclosed concepts, the block diagram of test system 800 illustrated in FIG. 8 has been simplified. In other embodiments, different and/or additional circuit blocks and different configurations of the circuit blocks are possible and contemplated.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. An apparatus, comprising:
   a memory circuit including a plurality of sub-arrays, wherein the memory circuit is configured to implement a retention mode according to stored information indicating voltage sensitivities for the plurality of sub-arrays; and
   a voltage control circuit coupled to a power supply node, wherein during the retention mode for the plurality of sub-arrays, the voltage control circuit is configured to:
      generate, based on the stored information, a first retention voltage level for a first subset of the plurality of sub-arrays; and
      generate, based on the stored information, a second retention voltage level, higher than the first retention voltage level, for a second subset of the plurality of sub-arrays; and
      wherein the first and second retention voltage levels are lower than a power supply voltage level of the power supply node, and wherein the second subset includes one or more voltage sensitive data storage cells that fail to retain data at the first retention voltage level.

2. The apparatus of claim 1, wherein the stored information includes test information generated from a test procedure that indicates that one or more voltage sensitive data storage cells are included in the second subset of the plurality of sub-arrays.

3. The apparatus of claim 1, wherein the stored information indicates a minimum voltage level at which the one or more voltage sensitive data storage cells can retain data in the retention mode.

4. The apparatus of claim 1, further comprising a fuse memory configured to retain the stored information, wherein at least one fuse circuit in the fuse memory is configured to retain stored information for a particular one of the plurality of sub-arrays.

5. The apparatus of claim 1, further comprising a set of transconductance devices, each with a different transconductance property, coupled to a power node of a particular one of the plurality of sub-arrays, and wherein to generate the first retention voltage level, the voltage control circuit is configured to enable a first one of the set of transconductance devices.

6. The apparatus of claim 1, further comprising a particular set of transconductance devices, a first transconductance device of the set coupled to a first impedance circuit that is further coupled to a power node of a particular one of the plurality of sub-arrays, and wherein to generate the first retention voltage level, the voltage control circuit is configured to enable the first transconductance device.

7. The apparatus of claim 6, further comprising a second transconductance device of the set coupled to a second impedance circuit that is further coupled to the power node of the particular one of the plurality of sub-arrays, and wherein to generate the second retention voltage level, the voltage control circuit is configured to disable the first transconductance device and enable the second transconductance device.

8. A method comprising:
   coupling, by a voltage control circuit, a power supply node to a plurality of sub-arrays included in a memory circuit;
   during activation of a retention mode for the memory circuit:

de-coupling, by the voltage control circuit, the plurality of sub-arrays from the power supply node;
generating, by the voltage control circuit using stored information, a first retention voltage level for a first subset of the plurality of sub-arrays; and
generating, by the voltage control circuit using the stored information, a second retention voltage level, higher than the first retention voltage level, for a second subset of the plurality of sub-arrays; and
wherein the first and second retention voltage levels are lower than a power supply voltage level of the power supply node, and wherein the second subset includes one or more voltage sensitive data storage cells that fail to retain data at the first retention voltage level.

9. The method of claim 8, wherein the stored information includes test generated information indicating, for a corresponding one of the plurality of sub-arrays, that at least one voltage sensitive data storage cell is included in the corresponding sub-array, wherein voltage sensitive data storage cells include data storage cells that fail to retain data at the first retention voltage level.

10. The method of claim 8, further comprising, in response to detecting a plurality of voltage sensitive data storage cells, replacing a subset of the plurality of voltage sensitive data storage cells with spare data storage cells.

11. The method of claim 8, wherein the stored information is retained in a non-volatile memory.

12. The method of claim 8, wherein the stored information includes a respective bit for corresponding ones of the plurality of sub-arrays; and
further comprising generating the first retention voltage level for ones of the plurality of sub-arrays for which the respective bit is not set, and generating the second retention voltage level for ones of the plurality of sub-arrays for which the respective bit is set.

13. The method of claim 8, further comprising:
generating the first retention voltage level by enabling a particular device of a first set of transconductance devices coupled to a particular sub-array of the first subset of sub-arrays; and
generating the second retention voltage level by enabling a different device of a second set of transconductance devices coupled to a particular sub-array of the second subset of sub-arrays; and
wherein the particular device has different transconductance properties than the different device.

14. The method of claim 8, further comprising:
generating the first retention voltage level by enabling a first number of a first set of transconductance devices coupled to a particular sub-array of the first subset of sub-arrays; and
generating the second retention voltage level by enabling a second number of a second set of transconductance devices coupled to a particular sub-array of the second subset of sub-arrays, wherein the first number is less than the second number.

15. A memory circuit, comprising:
a plurality of sub-arrays, including respective pluralities of data storage cells, configured to retain data values when a retention mode is active;
a voltage control circuit configured to:
couple the plurality of sub-arrays to a power supply node;
during activation of the retention mode:
decouple the plurality of sub-arrays from the power supply node;
using stored information, generate a first retention supply signal for a first subset of the plurality of sub-arrays, wherein a voltage level of the first retention supply signal is less than a voltage level on the power supply node; and
using the stored information, generate a second retention supply signal for a second subset of the plurality of sub-arrays, wherein a voltage level of the second retention supply signal is greater than the voltage level of the first retention supply signal and less than the voltage level on the power supply node; and
wherein the second subset includes one or more voltage sensitive data storage cells that fail to retain data at the voltage level of the first retention supply signal.

16. The memory circuit of claim 15, wherein the stored information includes test generated information that one or more voltage sensitive data storage cells are included in sub-arrays in the second subset, wherein the test generated information corresponds to minimum voltage levels at which the one or more voltage sensitive data storage cells can retain data in the retention mode.

17. The memory circuit of claim 15, further comprising a fuse memory configured to retain the stored information, wherein at least one fuse circuit in the fuse memory is configured to retain stored information for a particular one of the plurality of sub-arrays.

18. The memory circuit of claim 15, further comprising a respective set of transconductance devices coupled to a respective power node of each of the plurality of sub-arrays, and wherein the voltage control circuit is configured to:
generate the first retention supply signal for the first subset of the plurality of sub-arrays by enabling a first number of the respective set of transconductance devices coupled to the respective power nodes of each of the first subset of the plurality of sub-arrays; and
generate the second retention supply signal for the second subset of the plurality of sub-arrays by enabling a second number of the respective set of transconductance devices coupled to the respective power nodes of each of the second subset of the plurality of sub-arrays, wherein the second number is greater than the first number.

19. The memory circuit of claim 18, wherein each transconductance device included in a particular set of transconductance devices has the same transconductance properties as a respective one of a different set of transconductance devices.

20. The memory circuit of claim 15, wherein the voltage control circuit is configured to:
generate the first retention supply signal by enabling a particular device of a first set of transconductance devices coupled to a particular sub-array of the first subset of sub-arrays; and
generate the second retention supply signal by enabling a different device of a second set of transconductance devices coupled to a particular sub-array of the second subset of sub-arrays; and
wherein the particular device has different transconductance properties than the different device.

* * * * *